(12) United States Patent
Huber et al.

(10) Patent No.: US 6,643,558 B2
(45) Date of Patent: Nov. 4, 2003

(54) INSTALLATION FOR PROCESSING WAFERS

(75) Inventors: Ronald Huber, Poughkeepsie, NY (US); Rolf-Arno Klaebsch, Lostau (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/992,287

(22) Filed: Nov. 19, 2001

(65) Prior Publication Data

US 2002/0116086 A1 Aug. 22, 2002

Related U.S. Application Data

(63) Continuation of application No. PCT/DE00/01579, filed on May 17, 2000.

(30) Foreign Application Priority Data

May 19, 1999 (DE) .......................................... 199 22 936

(51) Int. Cl.⁷ .............................................. G06F 19/00
(52) U.S. Cl. ...................... 700/112; 700/99; 700/116; 700/121
(58) Field of Search .................. 700/121, 99, 112–116, 700/219, 225, 226, 103, 100; 414/273, 935, 937, 939, 940, 222.02

(56) References Cited

U.S. PATENT DOCUMENTS

| | | | |
|---|---|---|---|
| 5,014,208 A | * 5/1991 | Wolfson | 700/99 |
| 5,083,364 A | 1/1992 | Olbrich et al. | 24/564 |
| 5,375,062 A | * 12/1994 | Aoki | 700/99 |
| 5,495,417 A | * 2/1996 | Fuduka et al. | 700/121 |
| 5,536,128 A | 7/1996 | Shimoyashiro et al. | 414/273 |
| 5,751,581 A | * 5/1998 | Tau et al. | 700/115 |
| 5,803,932 A | 9/1998 | Akimoto et al. | 29/25.01 |
| 5,858,863 A | 1/1999 | Yokoyama et al. | 438/514 |
| 6,050,768 A | 4/2000 | Iwasaki et al. | 414/222.01 |
| 6,112,130 A | * 8/2000 | Fukuda et al. | 700/121 |
| 6,129,496 A | 10/2000 | Iwasaki et al. | 414/222.01 |

FOREIGN PATENT DOCUMENTS

| | | |
|---|---|---|
| DE | 37 35 449 A1 | 5/1989 |
| DE | 198 26 314 A1 | 12/1998 |
| DE | 198 16 151 A1 | 2/1999 |
| JP | 08 268 512 A | 10/1996 |

\* cited by examiner

*Primary Examiner*—Leo Picard
*Assistant Examiner*—Steven R. Garland
(74) *Attorney, Agent, or Firm*—Laurence A. Greenberg; Werner H. Stemer; Ralph E. Locher

(57) ABSTRACT

The wafer processing installation is disposed in one or more clean rooms. The installation has a configuration of processing units including fabrication units for executing individual fabricating steps and/or measuring units for checking fabricating steps. The processing units are connected by a transport system for sending the wafers in and out. The wafers are combined into variable batch sizes corresponding to the capacities of the processing units and/or the transport system.

9 Claims, 2 Drawing Sheets

INSTALLATION FOR PROCESSING WAFERS

CROSS-REFERENCE TO RELATED APPLICATION

This application is a continuation of International Application No. PCT/DE00/1579, filed May 17, 2000, which designated the United States.

BACKGROUND OF THE INVENTION

Field of the Invention

The invention relates to an installation for processing wafers.

These types of installations contain a number of processing units, with which various fabricating steps for processing wafers are carried out. The fabricating steps include etching processes, wet chemical processes, diffusion processes, and various purifying techniques such as CMP (Chemical Mechanical Polishing). One or more processing units are provided for each of these fabricating steps. In addition, measuring units are provided, wherein the quality of the wafer processing can be checked. These measuring units are expediently utilized to check all essential fabricating steps which are executed in the processing units.

The overall fabrication process is subject to stringent purity requirements, for which reason the processing units and measuring units are disposed in a clean room or a system of clean rooms.

The wafers are supplied to the individual processing units and measuring units in a predetermined batch size by way of a transport system. To accomplish this, the wafers are transported in transport containers, which are implemented in the form of cassettes, for instance, whereby the transport containers each accept an equal number of wafers. The wafers are also delivered out by way of the transport system after being processed in the fabrication and measuring units, whereby they are borne in the same transport containers. Typically, 25 wafers are combined into one batch in each transport container.

The transport system includes a conveyor system, which is constructed in the form of roll conveyors, for instance. The transport system additionally includes a storage system with a plurality of stores for storing transport containers with wafers.

In prior art wafer processing installations, a batch of wafers is combined in a transport container and fed through all fabrication and measuring units of the installation via the transport system. The batch remains attached to the respective transport container. This means that wafers from different batches are not mixed.

To process the wafers, a respective transport container containing a batch is fed to a processing unit or measuring unit via a loading and unloading station. After the wafers are processed in the fabrication or measuring unit, the batch is output to the transport system again via the loading and unloading station in the same transport container.

The transport containers with the wafers are successively fed to the individual fabrication and measuring units according to the order of the individual fabrication and measuring processes. This is problematic, because the individual fabrication and measuring units have different processing capacities. This is particularly ascribable to the fact that in some fabrication and measuring units a number of wafers can be processed in parallel, while in other fabrication and measuring units only individual wafers can be processed. For example, in furnace processes a number of wafers can be supplied to the furnace of a processing unit simultaneously. In measuring units, on the other hand, wherein an optical inspection is performed, the wafers are processed individually.

In order to guarantee an optimally high capacity utilization of the apparatus in spite of this problem, an optimally high number of transport containers with wafers are output to the transport system. The disadvantage of this is that a substantial stock of wafers is located in the apparatus. But such large material stocks in the apparatus are extremely cost-intensive. In addition, because such a large number of transport containers cannot be fed through the apparatus continuously, it is necessary to provide a plurality of stores for temporarily storing the transport containers.

Stores such as these are typically constructed as stockers. A stocker consists of a storage system wherein the wafers are stored under clean-room conditions. Stockers such as these are extremely cost-intensive owing to the large constructional outlay. Furthermore, stockers require a substantial amount of space in the clean room, which raises the cost of the installation still further.

These measures notwithstanding, owing to the different processing capacities it is impossible to prevent substantial wait times and associated downtimes in individual fabrication and measuring units. This, of course, leads to long throughput times of the wafers through the apparatus. Typical throughput times for wafer processing installations are in the range of 40 to 60 days.

U.S. Pat. No. 5,083,364 and German published patent application DE 37 35 449 A1 disclose a fabrication installation for wafers which is built from several interchangeable transport modules, processing modules, and check modules. Each processing module includes at least one processing station, one deposit and one handling device.

The wafers are sent in via the transport system in a first cassette. The handling device removes the wafers from the first cassette and feeds them to the processing stations and deposits. In the check module, unusable wafers are captured and potentially collected in a second cassette. The second cassette can serve for the temporary storage of the unusable wafers. Alternatively, the unusable wafers are channeled out of the check module. The flawless wafers are collected in cassettes and output on the transport module.

U.S. Pat. No. 5,803,932 describes a processing installation for processing wafers. That processing installation includes a loading/unloading section, a processing section and an interface section. In addition, a transport device and at least two waiting sections are provided.

The transport device is located between the loading/unloading section and the interface section. A number of processing units, which form processing sections, are disposed on either side of the transport device.

The wafers are transported on the transport device either in the direction of the loading/unloading section or in the direction of the interface section.

U.S. Pat. Nos. 6,050,768 and 6,129,496 (see German patent application DE 198 16 151 A1) relate to a control method for an automatic transporter of a semiconductor wafer cassette transport device. The transporter transports a semiconductor wafer cassette to an inlet port of a storage device under the control of a host computer.

Japanese patent application JP 08268512 A relates to a storage unit for storing substrates. The storage unit includes a sorting unit with the aid of which the substrates are automatically sorted and sent in and out of the storage unit in cassettes.

German patent application DE 198 26 314 A1 teaches a test device for automatically testing integrated circuits (IC). To carry out the tests, a plurality of testing heads are provided at a test table. A transport device for transporting individual ICs is provided at the test table. The transport device includes arms that are movable on rails and that include a gripper head for picking up the ICs.

SUMMARY OF THE INVENTION

It is accordingly an object of the invention to provide a wafer processing installation, which overcomes the above-mentioned disadvantages of the heretofore-known devices and methods of this general type and which achieves an optimally short throughput time of the wafers through the installation given an optimally high utilization of the capacity of the fabrication and measuring units.

With the foregoing and other objects in view there is provided, in accordance with the invention, an installation for processing wafers, comprising:

a configuration of processing units (e.g., fabrication units for executing individual fabricating steps and measuring units for checking the results of the fabricating steps) disposed in one of more clean rooms;

a transport system interconnecting the processing units for transporting wafers to and from the processing units, wherein the wafers are combined into variable batch quantities, adapted to capacities of at least one of the processing units and the transport system, in transport batches for transport on the transport system and processing batches for processing in the processing units;

computing units connected to the processing units and the transport system, and a fabrication control connected to the computing units for selectively combining a plurality of wafers into a batch;

the fabrication control transmitting a control command to a computing unit of the transport system for compiling a transport batch, the control command including information regarding a size of the batch and a processing unit constituting a destination for the transport batch;

wherein, upon reaching the destination, the transport batch is dismantled in the respective the processing unit, and the wafers of the batch are converted into a processing batch;

wherein, after being processed in the processing unit, the processing batch is dismantled and converted into at least one transport batch; and the fabrication control transmitting a control command to a computing unit of the processing unit for compiling the at least one transport batch, and the control command containing an identification, a batch size, and a destination selected from the group consisting of a fabrication unit, a measuring unit, and a store of a storage system of the installation.

The wafers, according to the invention, are combined into variable batches sizes, which are adapted to the capacities of the processing units, measuring units and/or transport system. The wafers are combined into transport batches for transport on the transport system and processing batches for processing in the fabrication or measuring units.

The basic idea of the invention is to do away with the attachment of the wafer to a particular batch of a strictly prescribed size.

The transport of the wafers by way of the transport system is accomplished in variable batch sizes, whereby the individual batch sizes are adapted to the processing capacity and the instantaneous level of capacity utilization of a fabrication or measuring unit to which the wafers are being fed.

In the individual fabrication and measuring units, the wafer batches which are sent in by the transport system are divided up and combined into new batch quantities according to the demand and capacity of the fabrication or measuring unit, and processed at the same time in a new batch. If the wafers are already being sent in by way of the transport system in the batch size which is demanded by the respective fabrication or measuring unit, the dismantling of the old batch and compiling of a new batch can be omitted.

After a batch is processed in a fabrication or measuring unit, this batch is dismantled again, and new batches of wafers are created therefrom, as needed, which are then fed to the transport system. The individual batches are then fed to subsequent fabrication or measuring units according to the processing order in the overall process.

The batches can include up to 300 wafers, depending on the individual fabrication and measuring units. Likewise, very small batches can also be provided, including even a batch of one. Accordingly, single-wafer processing is also possible in the inventive apparatus. Marks are then made on the wafers, with the aid of which the wafers are identifiable by suitable identification apparatuses.

By adapting the batch sizes to the capacities of the individual fabrication and measuring units, the throughputs in the individual fabrication and measuring units can be effectively balanced. The wait times and downtimes of the individual fabrication and measuring units are thereby substantially shortened, and a short throughput time of the wafers through the apparatus is achieved. Another consequence of this is that only a small number of wafers are still stored in the temporary store, since few overcapacities, if any, occur in the transport system by virtue of the demand-sensitive supplying of wafers to the fabrication and measuring units. This makes it possible to forgo cost-intensive stores and to substantially reduce the stock of wafers in the apparatus.

In accordance with an added feature of the invention, the transport batches and processing batches are of different sizes.

In accordance with an additional feature of the invention, a batch quantity includes at least one wafer.

In accordance with another feature of the invention, markers are disposed on the wafers, for individual identification of the wafers.

In accordance with a further feature of the invention, a plurality of transport containers are provided, each accommodating a respective batch. The batches are preferably identified with an identifying marker.

In accordance with again an added feature of the invention, the transport system includes a conveyor system and a storage system with at least one store, and each conveyor system and storage system includes at least one the computing unit. There are also provided a plurality of reading devices for reading the markers on the wafers connected to the computing units.

In accordance with again an additional feature of the invention, the control command contains a transport time for feeding the transport batch to the destination.

In accordance with again another feature of the invention, in order to dismantle a transport batch, a computing unit of a processing unit constituting the destination transfers a control command to the fabrication control, whereupon the identifying marker of the transport batch is erased from the fabrication control. Preferably, the identifying marker of the processing batch generated in the processing unit is read into the computing unit of the processing unit by the fabrication control.

In accordance with again a further feature of the invention, in order to dismantle a processing batch, the computing unit of the respective processing unit transfers a control command to the fabrication control, whereupon the fabrication control transfers to the computing unit a reply with a control command for compiling at least one transport batch.

In accordance with a concomitant feature of the invention, upon receiving the control command for dismantling the processing batch sent by the computing unit of the processing unit, the identifying marker of the processing batch is erased from the fabrication control.

In the case in which a central control, i.e., a fabrication control is provided, the transport system and the individual fabrication and measuring units include computing units, which are connected to the fabrication control. The compiling and dismantling of the batches are then accomplished by a communication of control commands from the fabrication control to the computing units, with information being fed back in the reverse direction from the computing units to the fabrication control by way of the transport system and the fabrication and measuring units.

Other features which are considered as characteristic for the invention are set forth in the appended claims.

Although the invention is illustrated and described herein as embodied in an installation for processing wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
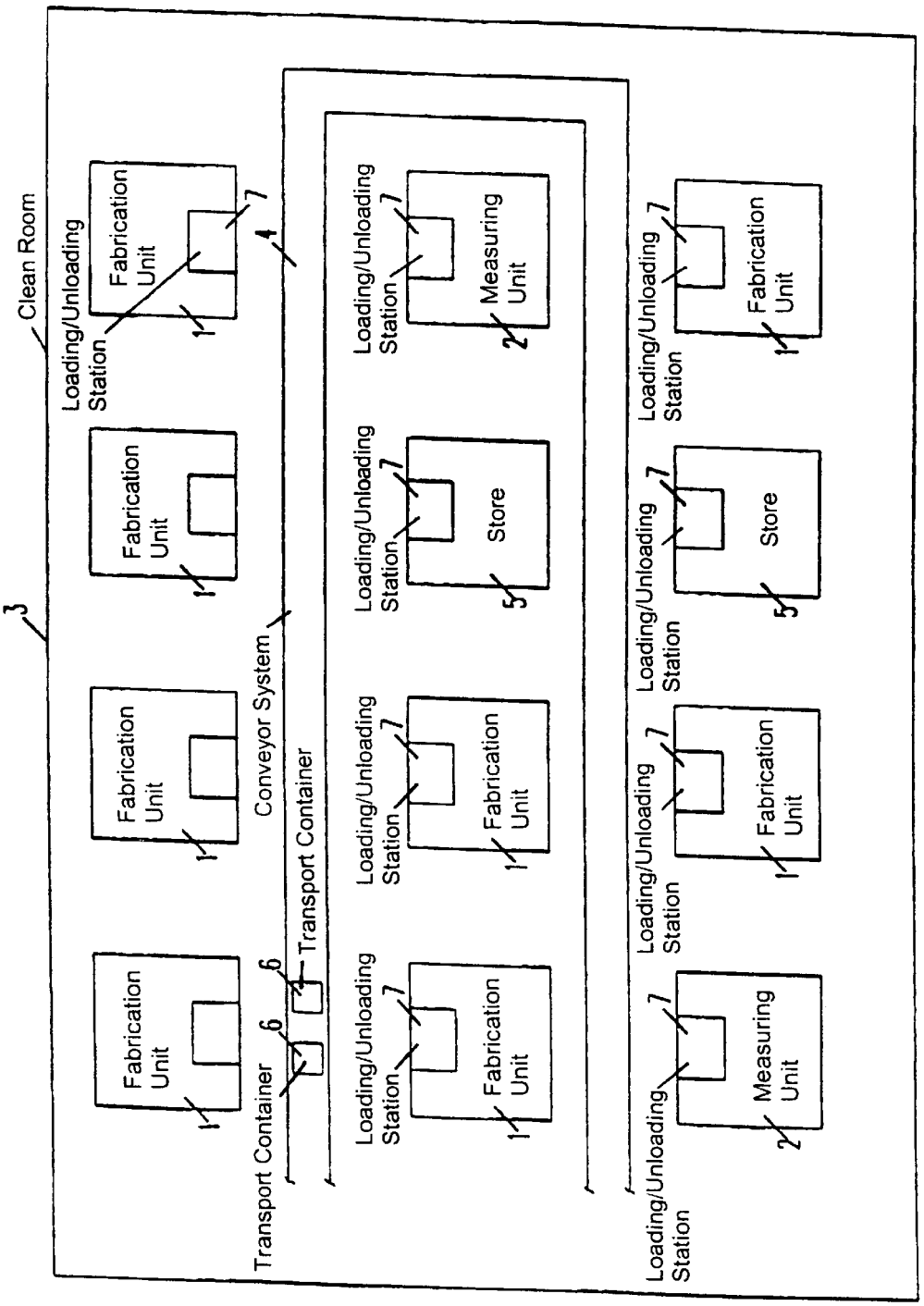
FIG. 1 is a schematic representation of an installation for processing wafers including several processing units and measuring units.

Referring now to the figures of the drawing in detail and first, particularly, to FIG. 1 thereof, there is shown an exemplary embodiment of an installation for processing wafers. The installation, or apparatus, includes a number of fabrication units 1 for carrying out processing steps that are required for fabricating the wafers. Such steps include treatment processes in etching techniques, wet chemical methods, diffusion processes, and purifying methods. One or more fabrication units 1 can be provided for each of these fabricating steps.

In addition, the system includes a number of measuring units 2, wherein the results of the individual fabricating steps are checked.

The fabrication units 1 and the measuring units 2, commonly referred to as processing units 1, 2 in the following claims, are disposed in a clean room 3. Alternatively, the installation can be distributed over a system of clean rooms 3.

The fabrication units 1 and measuring units 2 are connected to each other by a transport system. The transport system includes a conveyor system 4 and a storage system. The conveyor system 4 can be an apparatus of roll conveyors, for example. The stores 5 of the storage system are preferably realized as stockers.

The wafers are transported by the conveyor system 4 in transport containers 6. The transport containers 6 can be constructed in the form of cassettes or the like.

In the present case, all operations in the apparatus are automated. In principle, individual operations or all operations can also be executed manually.

Each of the processing units 1, measuring units 2, and stores includes at least one loading and unloading station 7 for transporting wafers in and out.

Figure 2:
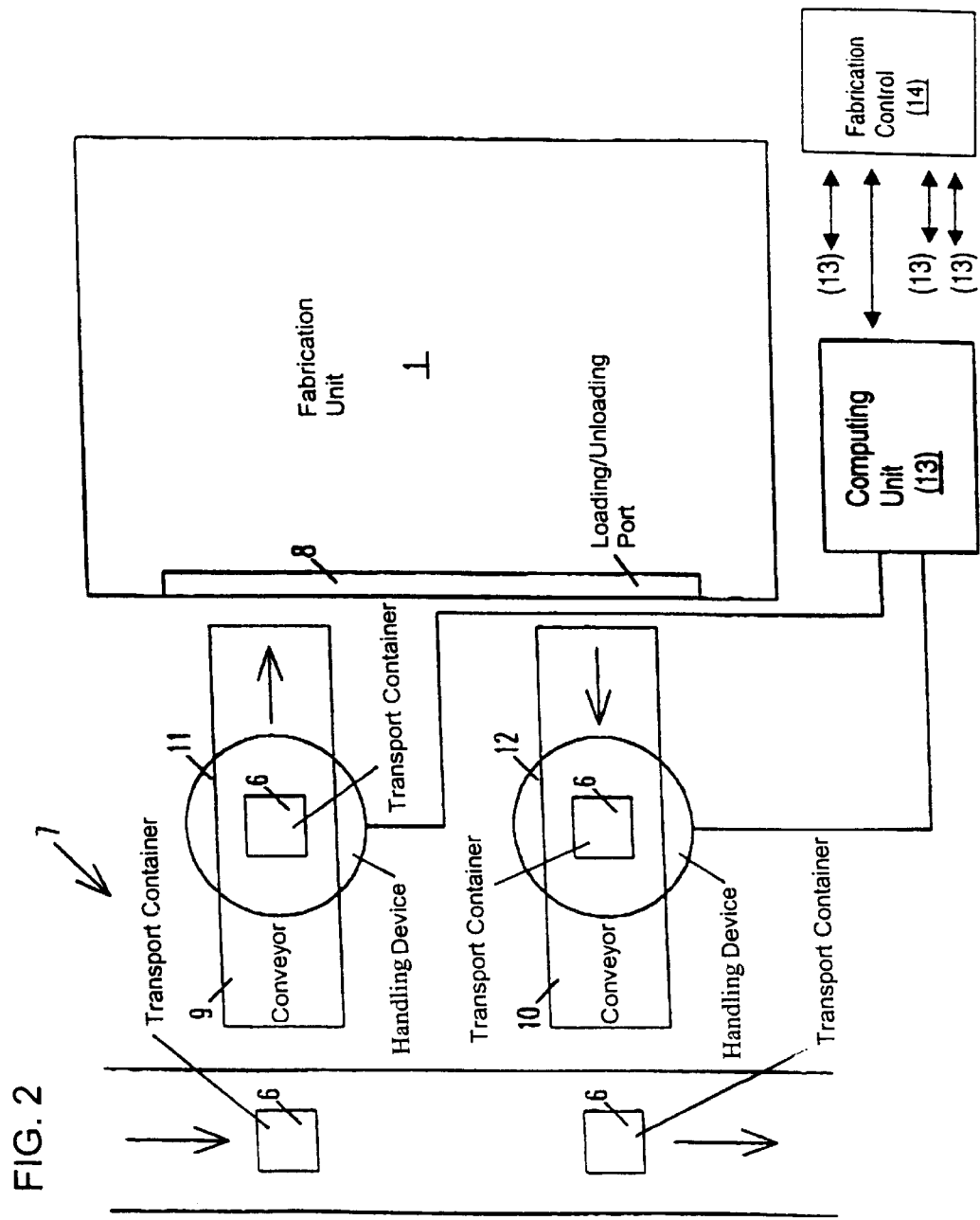
FIG. 2 is a schematic view of a loading and unloading station for a processing unit.

Referring now to FIG. 2, there is shown an exemplary embodiment of a fabrication unit 1 with a loading and unloading station 7 for sending wafers in and out. The loading and unloading station 7 includes a loading and unloading port 8 at the front side of the fabrication unit 1, via which wafers can be fed into and out of the fabrication unit 1. In principle, several loading and unloading ports 8 can also be provided. The loading and unloading station 7 also includes two conveyors 9, 10, which connect the conveyor system 4 of the transport system to the loading and unloading port 8 of the fabrication unit 1. The conveyors 9, 10 can be roll conveyors or the like. A first conveyor 9 serves for feeding wafers which are inputted to the conveyor system 4 of the transport system in transport containers 6 to the fabrication unit 1. The second conveyor 10 serves for transporting the wafers which are output to the conveyor system 4 in second transport containers 6 out of the unit. A handling device 11, 12 for handling the wafers is provided at each conveyor 9, 10. Expediently, a reading device is provided at each handling device 11, 12. Marks which are made on the wafers can be read with the reading device, making it possible to identify and track individual wafers. The marks can be bar codes. In that case, the reading devices are bar code readers. The handling devices 11, 12 with the reading devices are connected to a computing unit 13. The computing unit 13 is expediently a component of a console, at which the fabrication unit 1 can be operated and controlled by operating personnel.

These types of loading and unloading stations 7 with a computing unit 13 are expediently provided at each fabrication unit 1 and measuring unit 2. In addition, such units are also provided at the stores 5 of the storage system. Finally, additional computing units 13 can be provided at the conveyor system 4 of the transport system, which control the transport of wafers in and out of the clean room 3. In the apparatus represented in FIG. 1, all computing units 13 are connected to a central fabrication control, which can also be a computing unit.

The wafers, according to the invention, are combined in variable batch sizes, which are adapted to the capacities of the processing units 1, the measuring units 2, and/or the transport system 4. These batches or lots can typically include up to 300 wafers, depending on the instance, though a batch size of one can also be provided, with an individual wafer forming a respective batch. The batches are automatically compiled or dismantled by the fabrication control in dependence upon the capacity requirements of the individual processing units 1 and measuring units 2. Transport batches and processing batches are thus distinguished in the fabrication control. The wafers are guided on the transport system as transport batches. Next, the wafers are processed in the respective processing units 1 or measuring units 2 grouped in processing batches. In particular, the batch sizes for the transport and processing batches may differ.

The wafers of a batch are expediently accommodated in a transport container 6. The size of the transport containers 6 may be adapted to the different batch sizes.

The individual batches are identifiable with the aid of an identifying marker. In the simplest case, the identifying markers are the marks on the wafers of the batch. It is particularly advantageous to define the identifying marker in this way given single-wafer processing, wherein a batch includes only one wafer. Alternatively, the wafers of a batch can be combined in a transport container 6, and a corresponding identifying marker, for instance in the form of a mark, can be placed on the transport container 6.

The passage of the wafers through the apparatus represented in FIG. 1 is controlled and monitored by the central processing or fabrication control. In order to process the wafers in a fabrication unit 1 or measuring unit 2, they are fed to the respective fabrication unit 1 and measuring unit 2 over the transport system. At the beginning of the processing sequence, a definite number of wafers are sent out of a store 5 of the storage system and fed to a fabrication unit 1 as represented in FIG. 2, for instance. Alternatively, the wafers can be fed from outside the clean room 3 directly to the conveyor system 4, which guides them to the fabrication unit 1. In any case, the wafers are transported to the fabrication unit 1 in a transport batch whose size corresponds to the capacity of the fabrication unit 1.

To accomplish this, a control command is output to the corresponding computing unit 13 of the transport system by the fabrication unit 1. With this control command, the gathering of a transport batch for the fabrication unit 1 is triggered. This control command contains the fabrication unit 1, which constitutes the destination, as well as the size of the transport batch that is to be formed. The instantaneous wafer demand in the respective fabrication unit 1 is interrogated by the fabrication control in advance, so that the batch size is adapted to the instantaneous demand of the fabrication unit 1.

With the aid of a handling device or the operator, the wafers of a transport batch are output to the transport system in a transport container 6. With the gathering of the transport batch, a transport job is generated in the fabrication control, with the aid of which the transport batch is monitored in the fabrication control. The transport job contains the identifying marker of the transport batch, the destination, and additional data, as warranted, such as the time of delivery of the transport batch to the respective fabrication unit 1, for example.

FIG. 2 represents the case wherein two transport containers 6, each with a transport batch, are fed to the fabrication unit 1 by the conveyor system 4 via the conveyor 9. One of the transport containers 6 is located in the region of the handling device 11.

The computing unit 13, which is connected to the handling unit 11, acknowledges the arrival of the transport batch at the fabrication unit 1. The transport batch is recognized in the computing unit 13 of the loading and unloading station 7 with the aid of the identifying marker, whereupon the identifying marker is read into the fabrication control.

Next, the transport batch is dismantled and converted into a processing batch by the fabrication control. To accomplish this, the corresponding transport job with the corresponding identifying marker in the fabrication control is erased. When the transport job is erased, the wafers of the transport batch are taken off of the scheduling operation of the apparatus. At the same time, a fabrication job is created in the fabrication control, with the aid of which the passage of processing batch through the fabrication unit 1 can be controlled.

In the simplest case, the size of the transport batch corresponds to the size of the processing batch. This is the case when the number of wafers which are sent in corresponds exactly to the instantaneous demand of the fabrication unit 1. In this case, the wafers remain in the transport container 6 of the transport batch and are registered as the processing batch in the fabrication control with the identification of the transport container 6.

If the demand of fabrication unit 1 does not precisely match the size of the transport batch, several transport batches can be combined into a processing batch by means of the handling device 11, whereby the processing batch is expediently borne in an additional transport container 6 with an additional identifying marker. Likewise, the wafers of one transport batch can be distributed to several processing batches, which are fed to the fabrication unit 1 in succession. In this case, each processing batch gets a separate identifying marker and a separate fabrication job.

After a processing batch has been processed in the fabrication unit 1, it is output to the second conveyor 10 by way of the loading and unloading port 8 and goes to the second handling device 12. In the connected computing unit 13, the processing batch is identified with the aid of the identifying marker and the fabrication job. To accomplish this, all the processing batches which are processed in the fabrication unit 1 are stored in the allocated computing unit 13.

Once the processing batch has been identified, it is dismantled and converted into at least one transport batch. To accomplish this, a control command is transferred to a fabrication control 14 by the computing unit 13 of the fabrication unit 1. As a reply, the fabrication control sends a control command for putting together one or more transport batches.

These transport batches are compiled in dependence upon the capacities of the downstream processing units 1 and measuring units 2. To accomplish this, the downstream processing units 1 and measuring units 2 are interrogated by the fabrication control. One or more transport batches are compiled from the processing batch according to the capacity demands of the respective processing units 1 and measuring units 2. In principle, it is also possible to combine a plurality of processing batches into one transport batch. If one processing batch is to be converted into a number of transport batches, the wafers of the processing batch are placed in different transport containers 6 by the handling device 12. In any case, each transport batch is identified and checked in the fabrication control with the aid of an identifying marker and a transport job. With the generation of a transport job, the wafers of the relevant transport batch are reincorporated into the scheduling operation of the apparatus. At the same time, with the generation of the transport jobs, the corresponding fabrication job is deleted. The wafers of the various transport batches are then guided to the next destinations, where the processing of the wafers proceeds analogously to the exemplary embodiment represented in FIG. 2.

We claim:

1. An installation for processing wafers, comprising:
   a configuration of processing units selected from the group consisting of fabrication units for executing individual fabricating steps and measuring units for checking fabricating steps disposed in at least one clean room;
   a transport system interconnecting said processing units for transporting wafers to and from said processing units, wherein the wafers are combined into variable batch quantities, adapted to capacities of at least one of said processing units and said transport system, in transport batches for transport on said transport system and processing batches for processing in said processing units;

computing units connected to said processing units and said transport system, and a fabrication control connected to said computing units for selectively combining a plurality of wafers into a batch;

said fabrication control transmitting a control command to a computing unit of said transport system for compiling a transport batch, the control command including information regarding a size of the batch and a processing unit constituting a destination for the transport batch;

the transport batch being dismantled in the respective said processing unit upon reaching said destination, and the wafers of the batch being converted into a processing batch;

one of said computing units of one of said processing units constituting said destination transferring a control command to the fabrication control for dismantling a transport batch, causing an identifying marker of the transport batch to be erased from said fabrication control;

said fabrication control reading an identifying marker of the processing batch generated in said processing unit into said computing unit of said processing unit;

the processing batch being dismantled and converted into at least one transport batch after being processed in said processing unit;

said computing unit of the respective processing unit transferring a control command to said fabrication control for dismantling a processing batch, causing said fabrication control to transfer to said computing unit a reply with a control command for compiling at least one transport batch;

the identifying marker of the processing batch being erased from the fabrication control upon receiving the control command for dismantling the processing batch sent by the computing unit of the processing unit; and said fabrication control transmitting a control command to a computing unit of said processing unit for compiling the at least one transport batch, and the control command containing an identification, a batch size, and a destination selected from the group consisting of a fabrication unit, a measuring unit, and a storage device of a storage system of the installation.

2. The installation according to claim 1, wherein the transport batches and processing batches are of different sizes.

3. The installation according to claim 1, wherein a batch quantity includes at least one wafer.

4. The installation according to claim 1, wherein markers are disposed on the wafers, for individual identification of the wafers.

5. The installation according to claim 4, which comprises a plurality of reading devices for reading the markers on the wafers connected to said computing units.

6. The installation according to claim 1, which comprises a plurality of transport containers each accommodating a respective batch.

7. The installation according to claim 1, wherein the batches are identifiable by reference to the identifying marker.

8. The installation according to claim 1, wherein said transport system includes a conveyor system and a storage system with at least one store, and each conveyor system and storage system includes at least one said computing unit.

9. The installation according to claim 1, wherein the control command contains a transport time for feeding the transport batch to the destination.

\* \* \* \* \*